United States Patent [19]

Vora

[11] Patent Number: 4,512,075
[45] Date of Patent: Apr. 23, 1985

[54] METHOD OF MAKING AN INTEGRATED INJECTION LOGIC CELL HAVING SELF-ALIGNED COLLECTOR AND BASE REDUCED RESISTANCE UTILIZING SELECTIVE DIFFUSION FROM POLYCRYSTALLINE REGIONS

[75] Inventor: Madhukar B. Vora, Los Gatos, Calif.

[73] Assignee: Fairchild Camera & Instrument Corporation, Mountain View, Calif.

[21] Appl. No.: 517,564

[22] Filed: Jul. 28, 1983

Related U.S. Application Data

[63] Continuation of Ser. No. 106,428, Aug. 4, 1980, abandoned.

[51] Int. Cl.³ .................. H01L 21/225; H01L 21/31
[52] U.S. Cl. .................... 29/577 C; 29/576 B; 29/578; 29/590; 29/591; 148/1.5; 148/175; 148/188; 148/190; 156/643; 156/653; 357/34; 357/35; 357/36; 357/46; 357/59; 357/92
[58] Field of Search ............. 148/175, 187, 188, 190, 148/174, 1.5; 29/577 C, 578, 590, 591, 576 B; 156/643, 653; 357/34, 35, 36, 46, 59, 92

[56] References Cited

U.S. PATENT DOCUMENTS

| | | | |
|---|---|---|---|
| 3,962,717 | 6/1976 | O'Brien | 148/175 X |
| 4,148,054 | 4/1979 | Hart et al. | 357/92 |
| 4,148,055 | 4/1979 | Edlinger et al. | 357/92 X |
| 4,160,989 | 7/1979 | de Bribisson et al. | 357/92 |
| 4,190,466 | 2/1980 | Bhattacharyya et al. | 357/50 |
| 4,322,882 | 4/1982 | Vora | 357/59 |
| 4,338,622 | 7/1982 | Feth et al. | 357/59 |

FOREIGN PATENT DOCUMENTS

EP-2670  7/1979  European Pat. Off. .......... 357/59 R

OTHER PUBLICATIONS

Feth et al., "Layout Image for Merged-Transistor Logic", I.B.M. Tech. Discl. Bull., vol. 22, No. 7, Dec. 1979, pp. 2948-2951.
Hennig et al., IEEE J. of Solid State Circuits, vol. SC 12, No. 2, Apr. 1977, pp. 101-109.
Middelhoek et al., IEEE J. of Solid State Circuits, vol. SC 12, No. 2, Apr. 1977, pp. 135-138.
Mulder et al., IEEE J. of Solid State Circuits, vol. SC 11, No. 3, Jun. 1976, pp. 379-385.
Berger et al., IBM Tech. Discl. Bulletin, vol. 22, No. 7, Dec. 1979, pp. 2786-2788.
Tang et al., IEEE International Electron Dev. Meeting, Technical Digest, pp. 201-204, Dec. 2, 1979.
Berger et al., IBM Tech. Discl. Bulletin, vol. 21, No. 12, May 1979, p. 4886.
Jaeger et al., IBM Tech. Discl. Bulletin, vol. 19, No. 10, Mar. 1977, pp. 3942-3946.
Yeh, IBM Tech. Disclosure Bulletin, vol. 22, No. 9, Feb. 1980, pp.4047-4051.

*Primary Examiner*—William G. Saba
*Attorney, Agent, or Firm*—Carl L. Silverman; Clif L. Anderson; Ronald Craig Fish

[57] ABSTRACT

Base resistance in an integrated injection logic cell is reduced by providing a low resistance conductive path over the device cell and contacting the base regions of vertical transistors in the cell. In fabricating the I²L cell a first intrinsic polysilicon layer is formed over the surface of the device cell, and N-type dopant is diffused through the polysilicon layer to form the N+ collectors of the NPN vertical transistors. Silicon oxide is formed over the doped polysilicon and the undoped intrinsic polysilicon is then removed. Exposed edge portions of the N doped polysilicon is then oxidized to completely insulate the surface of the polysilicon. A second layer of intrinsic polysilicon is then formed over the device cell and P type dopant is diffused through the second polysilicon layer to form the emitter and collector of a lateral PNP transistor and to contact the base regions of the NPN vertical transistors between the N+ collectors. The self-aligned collectors and bases of the NPN transistors and the reduced base resistance increases the speed of the I²L device.

7 Claims, 9 Drawing Figures

METHOD OF MAKING AN INTEGRATED INJECTION LOGIC CELL HAVING SELF-ALIGNED COLLECTOR AND BASE REDUCED RESISTANCE UTILIZING SELECTIVE DIFFUSION FROM POLYCRYSTALLINE REGIONS

This application is a continuation of application Ser. No. 106,428, filed Aug. 4, 1980, now abandoned.

BACKGROUND OF THE INVENTION

1. Field of the Invention

This invention relates generally to semiconductor technology and integrated circuit structures, and more particularly the invention relates to integrated injection logic cells and the method of making same.

2. Description of the Prior Art

Integrated injection logic is a simple form of bipolar logic in which PNP and NPN transistors form a gate with one transistor injecting the base or drive current to control the conductance of the other transistor. In integrated injection logic cells the transistor structures are merged with the injector transistor formed laterally across the surface of a device cell and controlling the conductance of one or more complementary transistors which are vertically oriented in the cell.

Oxide isolated integrated injection logic cells are disclosed in U.S. Pat. No. 3,962,717 to O'Brien, and are discussed by Hennig, Hingarh, O'Brien, and Verhofstadt in "Isoplanar Integrated Injection Logic" *Journal of Solid State Circuits*, Vol. SC 12, No. 2, April, 1977 pp. 101-9. Inherent advantages of the oxide isolated integrated injection logic cell include reduced size of circuit elements, simplicity of fabrication processes, and low power requirements. However, heretofore a limitation inherent in an integrated injection logic cell having a fanout of two or more is the tradeoff between base resistance and the size of the device cell. More particularly, base resistance has been reduced by increasing the size of the extrinsic base region which also increases the device cell size and attendant capacitance.

SUMMARY OF THE INVENTION

Accordingly, an object of the present invention is an improved integrated injection logic gate structure.

Another object of the invention is an integrated injection logic structure having reduced size and reduced base resistance.

Still another object of the invention is the method of fabricating an integrated injection logic structure with a self-aligned collector and base.

Yet another object of the invention is a method of interconnecting the base regions of an integrated injection logic cell without increasing the size of the extrinsic base region.

A feature of the invention is a low resistance conductive path overlying the surface of the integrated injection logic cell which interconnects base regions of the vertical transistors.

Briefly, in accordance with the present invention a lateral PNP transistor is formed in a first surface portion of a device region in a semiconductor body, and a plurality of NPN vertical transistors are serially spaced from the lateral PNP transistor with a transistor region of each of the NPN vertical transistors abutting the surface of the device region. A first plurality of conductive lines are provided over the surface of the device region with each of the first plurality of lines electrically contacting one of the transistor regions. An insulative material is formed over the first plurality of conductive lines, and a second conductive line is provided over the first plurality of conductive lines and over the transistor regions with the insulative material electrically isolating the second conductive line from the first plurality of conductive lines. The second conductive line electrically contacts surface portions of the device region intermediate said transistor regions thereby providing a low resistance interconnection between the intrinsic base regions of the vertical PNP transistors.

In fabricating the integrated injection logic structure in accordance with the invention, a first polycrystalline semiconductor layer is formed over the surface of the device region, and a dopant masking layer is formed over the first polycrystalline semiconductor layer. Portions of the dopant masking layer are removed and N type dopant is diffused through the exposed first polycrystalline layer and into the device region. Thereafter, the exposed surface of the first polycrystalline semiconductor layer is oxidized, after which the dopant masking layer is removed along with the polycrystalline semiconductor material underlying the dopant masking layer. The exposed portions of the remaining first polycrystalline layer are then oxidized. A second polycrystalline semiconductor layer is formed over the device region and over the first polycrystalline layer with the semiconductor oxide electrically isolating the first polycrystalline semiconductor layer from the first polycrystalline semiconductor material. Thereafter, a dopant masking layer is formed over the second polycrystalline semiconductor layer where the base region of the lateral PNP transistor is to be formed, and a P type dopant is then diffused through the second polycrystalline semiconductor layer and into the device region where the second polycrystalline semiconductor layer contacts the device region, said P type dopant forming the emitter and collector elements of the lateral PNP transistor and providing a low resistance interconnection of the base regions of said vertical NPN transistors. The exposed second polycrystalline layer is oxidized, and the dopant masking layer and undoped polycrystalline semiconductor material are removed. The exposed surface of the N-type semiconductor material is then oxidized.

In a preferred embodiment the polycrystalline semiconductor material is polysilicon and the dopant masking layer comprises silicon nitride.

The invention and objects and features thereof will be more readily apparent from the following detailed description and appended claims when taken with the drawing, in which:

DESCRIPTION OF THE PREFERRED EMBODIMENT(S)

Figure 1:
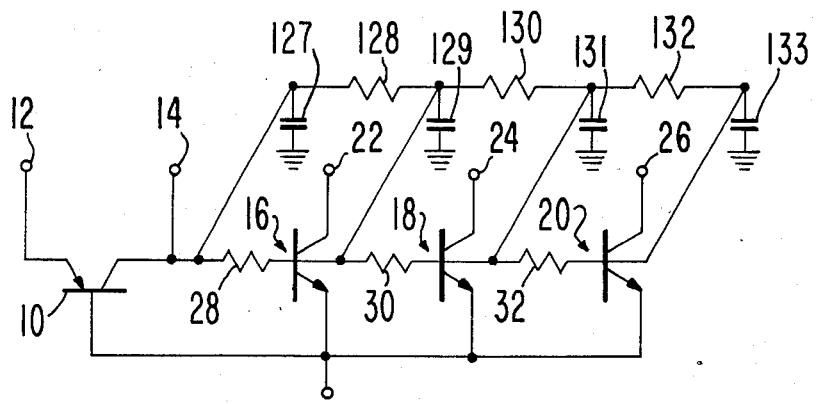
FIG. 1 is a schematic of an integrated injection logic gate.

Referring now to the drawings, FIG. 1 is an electrical schematic of an integrated injection logic (I$^2$L) cell having a fanout of three. The injector transistor 10, conventionally a PNP transistor constructed laterally in a device cell, has its emitter connected to an injector terminal 12 and its collector terminal connected to a base input 14. The lateral transistor structure 10 is merged with a plurality of vertical NPN transistors 16, 18, and 20 with the collector of PNP transistor 10 being integral with the bases of transistors 16, 18, and 20, and the base of transistor 10 being integral with the emitters of transistors 16, 18 and 20. The collector terminals of vertical transistors 16, 18 and 20 are connected to gate output terminals 22, 24, and 26, respectively.

As above discussed, an inherent limitation in the integrated logic cell having a fanout of two or more is the intrinsic base resistance 28, 30, and 32 in parallel with the extrinsic base resistance 128, 130, and 132 of the vertical transistors. The higher the base resistance the slower will be the operation of the logic cell. However, by reducing the base resistance with the extrinsic resistance 128, 130, 132, parasitic base-collector capacitance 127, 129, 131, and 133 is introduced into the structure.

Figure 2:
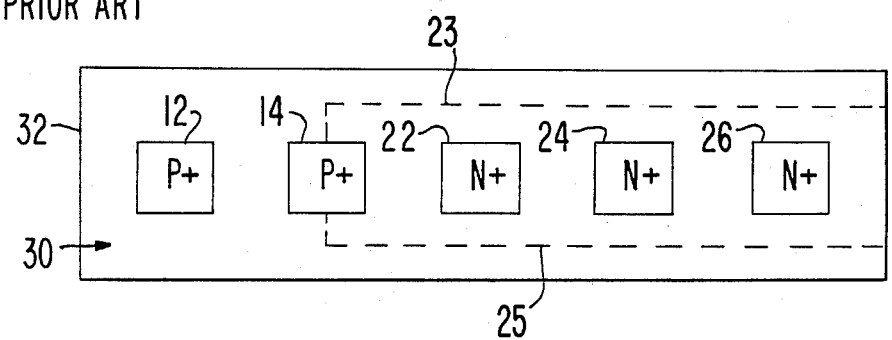
FIG. 2 is a plan view of a conventional integrated injection logic cell.

Heretofore the base resistance of an I$^2$L cell has been reduced by providing so called side rail conductive paths in the device cell. FIG. 2 is a plan view of a conventional I$^2$L device cell which corresponds to the schematic of FIG. 1. In an oxide isolated or isoplanar structure, the device cell shown generally at 30 is defined by dielectric material 32 which extends through an epitaxial layer on a semiconductor substrate and surrounds the device region 30. The emitter and collector regions of PNP transistor 10 are formed by P+ diffusions in the surface of the device region 30, and the collectors 22, 24, and 26 of the vertical NPN transistors are defined by N+ diffusions in the surface of the device region, as shown. To reduce the base resistance of the NPN transistors the side rails 23 and 25 are provided by P+ regions diffused on either side of the N+ collectors 22, 24, and 26 thereby interconnecting the intrinsic base regions of the NPN transistors with a low conductivity extrinsic base region. However, the provision of the side rail conductive paths 23 and 25 increases the surface area of the device cell 30 thus increasing the inherent capacitance of the cell and reducing the switching speed thereof.

In accordance with the present invention the side rails of the conventional I$^2$L cell are eliminated and an electrically conductive path is provided over the surface of the cell to interconnect the intrinsic base regions of the vertical transistors without introducing parasitic capacitance.

Figure 3:
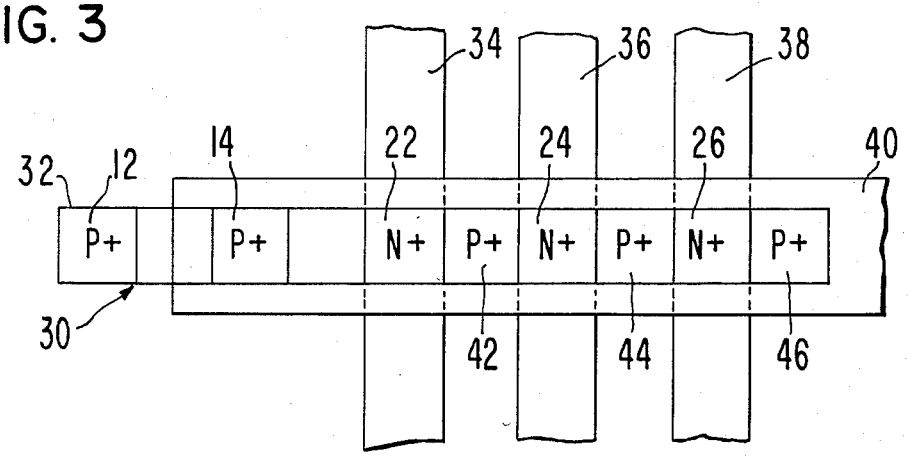
FIG. 3 is a plan view of one embodiment of an integrated injection logic cell in accordance with the present invention.

Referring now to FIG. 3, one embodiment of the cell in accordance with the invention is illustrated. Again, the cell is laid out in the format of the schematic of FIG. 1 and the same reference numerals for like elements are employed. A plurality of conductive lines 34, 36 and 38 overlie the N+ regions 22, 24 and 26, respectively, in electrical contact therewith. Preferably, the conductive lines 34, 36, 38 are doped polycrystalline silicon through which dopant is diffused to form the N+ regions 22, 24, and 26 of the transistors 16, 18, and 20 as will be described further hereinbelow. Another conductive layer 40 overlies the cell 30 and the conductive lines 34, 36, 38 with a dielectric material such as silicon oxide insulating the lines. Conductive line 40 preferably is P doped polycrystalline silicon which electrically contacts the P+ region 14 of the lateral PNP transistor 10 and also contacts the surface of the cell and heavily doped P+ regions 42 and 44 which are positioned between the N+ regions 22, 24, and 26, as illustrated. The P+ regions 42, 44, and 46 along with the P+ region 14 are formed by the diffusion of P type dopant through the polycrystalline layer 40 as will be described hereinbelow. Thus, the highly doped conductive layer 40 provides a low resistance path serially connecting the intrinsic P regions of the vertical NPN transistors 16, 18 and 20 thereby reducing base resistance 128, 130, 132 (as shown in FIG. 1) to a value much smaller than the prior art side rails and without introducing significant parasitic capacitance. The value of the base resistance now depends upon the width of layer 40 which can be increased without affecting the base-collector capacitance. Further, by eliminating the side rails the surface area of the device cell 30 is reduced.

Figure 4:
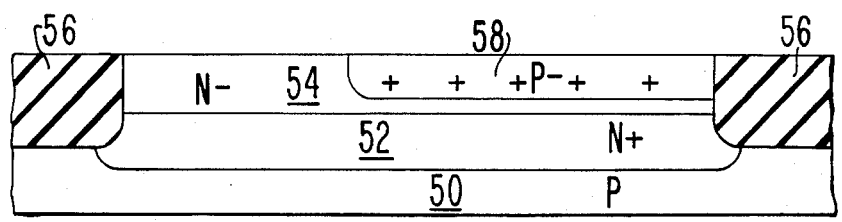
FIGS. 4-9 are side views in section illustrating the steps in fabricating an integrated injection logic cell in accordance with the present invention.

The method of fabricating the integrated injection logic structure of FIG. 3 using a unique arrangement of conventional semiconductor processing steps is illustrated in the sectional views of the cell structure in FIGS. 4–9. Referring to FIG. 4, the I$^2$L cell is fabricated in a semiconductor body comprising a P doped substrate 50 (e.g. $10^{16}$ boron atoms per cubic centimeter) having a heavily doped N+ region 52 (e.g. $10^{19}$ arsenic atoms per cubic centimeter) formed in a surface thereof with an N− epitaxial layer 54 (e.g. $10^{16}$ arsenic atoms per cubic centimeter) grown on the surface of substrate 50 overlying the heavily doped N+ region 52. An annular region of silicon oxide 56 extends through the epitaxial layer and surrounds the epitaxial material overlying the N+ region 52 which comprise the device region in the semiconductor body for the I$^2$L cell. P type ions such as boron are implanted in epitaxial layer 54 to provide the intrinsic base region 58 of the vertical NPN transistors. A dose of the order of $10^{12}$ boron atoms per square centimeter is implanted at a voltage of 190 kev.

Figure 5:
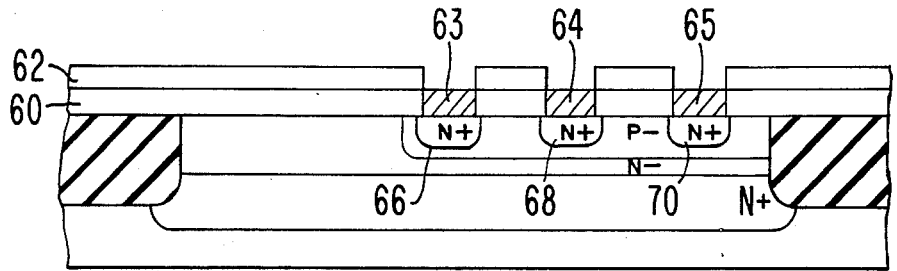

Referring now to FIG. 5, an intrinsic layer of polycrystalline silicon 60 is formed over the surface of the semiconductor body and a layer of silicon nitride 62 is then formed over the surface of the polysilicon layer 60. Using conventional photoresist masking and chemical etching techniques, windows are formed by removing portions of the silicon nitride 62 to define the locations for conductive lines 34, 36, and 38 of FIG. 3, and N type dopant such as arsenic is diffused through the underlying polysilicon layer regions 63, 64 and 65 to form the N+ regions 66, 68 and 70, respectively, in the surface of the epitaxial layer 54. The previously implanted boron ions in P− region 58 separate the N+ regions and the underlying N− region of the epitaxial layer 54.

Figure 6:
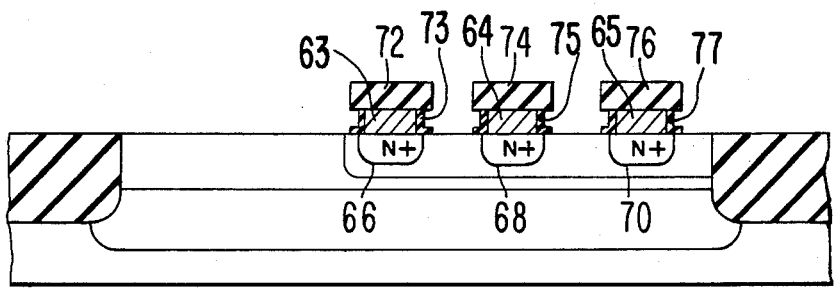

After the diffusion of the N type dopant into regions 66, 68 and 70, the exposed surface of the polycrystalline layer 60 is oxidized forming silicon oxide 72, 74, and 76, respectively. Thereafter, the silicon nitride 62 is removed and the exposed surface of polysilicon layer 60 is removed by a preferential etchant which does not attack the silicon oxide 72, 74, and 76. The resulting etching of the polysilicon undercuts the silicon oxide caps 72, 74, and 76 thereby reducing the width of the N+ polysilicon overlying the diffused regions 66, 68 and 70. Thereafter, the exposed surface of the epitaxial layer 54 and the exposed side walls of the N+ polysilicon are oxidized. This forms silicon oxide regions 73, 75, and 77 enclosing the N+ polysilicon 63, 64, and 65, respectively, above the N+ regions 66, 68, and 70, respectively. Thereafter, by selective etching such as plasma etching the silicon oxide is removed from the surface of the epitaxial layer 54 while leaving the silicon oxide 73, 75, and 77 around the N+ polysilicon overlying the N+ regions 66, 68 and 70 intact, as illustrated in FIG. 6.

Figure 7:
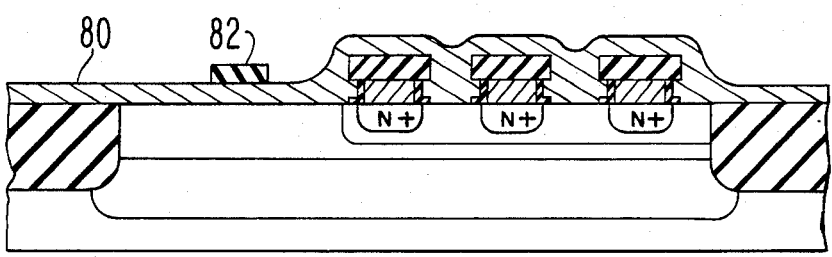
Figure 8:
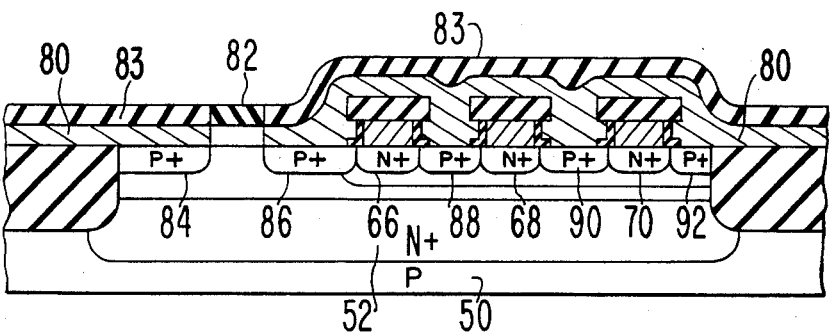

Referring now to FIG. 7 a second intrinsic polycrystalline silicon layer 80 is formed over the surface of the semiconductor body with a silicon nitride layer formed on the surface of the polysilicon layer 80. Thereafter, the silicon nitride is removed except for the region 82 which is positioned over the device cell where the base region of the PNP lateral transistor is to be formed. As illustrated in FIG. 8 a P type dopant such as boron is then diffused through the exposed surface of the polysilicon layer 80 during oxidation to form a P+ emitter 84 and P+ collector 86 of the lateral PNP transistor and oxide layer 83. The P type dopant also diffuses through the polysilicon layer 80 into the surface of the epitaxial layer between the N+ regions 66, 68 and 70 to form P+ regions 88, 90, and 92. Thus, the P doped polycrystalline layer 80 interconnects the collector 86 of the PNP transistor to the intrinsic base regions of the vertical NPN transistors through the contacts 88, 90, and 92 intermediate the surface oriented collectors 66, 68 and 70 of the vertical NPN transistors.

Figure 9:
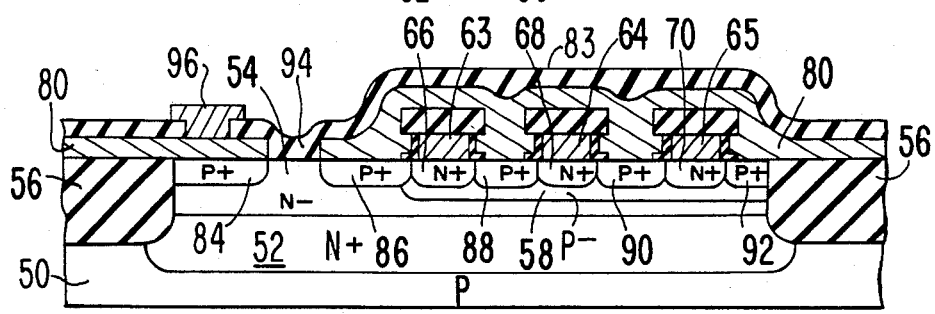

The completed transistor structure is illustrated in FIG. 9 in which the silicon nitride region 82 and the underlying polysilicon have been removed and a passivating silicon oxide layer 94 is thermally grown which is continuous with the oxide layer 83 over the surface of the I²L device. An injector contact 96 is made through the silicon oxide layer 94 to the P doped polysilicon 80 overlying P+ region 84. The contacts to the N+ collectors of the vertical NPN transistors are made to the conductor lines 63, 64 and 65, as illustrated in FIG. 3.

An oxide isolated integrated injection logic cell in accordance with the present invention is less than half the size of the conventional cell and has a gate delay less than half the gate delay of the conventional cell. Thus, the integrated injection logic cell in accordance with the present invention offers an overall improvement in size and speed over conventional integrated injection logic cell.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A method of fabricating a semiconductor structure having a lateral transistor and a plurality of vertical transistors in a device region of a first conductivity type in a semiconductor body along a surface thereof, the method comprising the steps of:

introducing a first semiconductor dopant of a second conductivity type opposite to the first conductivity type into a portion of the device region along the surface to form a doped region of the second conductivity type;

forming a first polycrystalline semiconductor layer on the surface;

selectively introducing a semiconductor dopant of the first conductivity type into (1) the first polycrystalline layer to form a like plurality of doped polycrystalline portions of the first conductivity type extending to the doped region and spaced apart from one another and (2) the doped region to form a like plurality of vertical current-conducting regions of the first conductivity type corresponding on a one-to-one basis to the polycrystalline portions and lying therebelow;

selectively subjecting the first polycrystalline layer to a first oxidizing environment to form a top electrically insulating covering at the exposed surface of each polycrystalline portion;

removing the remainder of the first polycrystalline layer except for a non-oxidized polycrystalline segment of each polycrystalline portion;

subjecting the polycrystalline segments to a second oxidizing environment to form a side electrically insulating covering at each exposed surface of each polycrystalline segment so as to define a composite covering for each polycrystalline segment comprising its top and side coverings and to leave a first electrically conductive line for each polycrystalline segment comprising its non-oxidized remainder;

forming a second polycrystalline semiconductor layer on the composite coverings and over the exposed sections of the device region; and selectively introducing a second semiconductor dopant of the second conductivity type into (1) the second polycrystalline layer and (2) the device region therebelow to form a pair of lateral current-conducting regions of the second conductivity type spaced apart from each other, of which a first one is continuous with the doped region and the second one is spaced apart therefrom.

2. A method as in claim 1 wherein the step of subjecting further includes subjecting the body to the second oxidizing environment to form a second top electrically insulating covering at each exposed surface to the device region and further including the step of removing the second top coverings except for a like plurality of pairs of portions thereof spaced apart from one another and corresponding on a one-to-one basis to the composite coverings, each pair of portions being continuous with its corresponding composite covering and in combination with the side coverings thereof overlying lateral boundary adjacent thereto of the corresponding vertical current-conducting region, surface portions of the device region adjacent to the intended locations for the lateral current-conducting regions thereby being exposed.

3. A method as in claim 2 wherein the step of removing the second top coverings comprises plasma etching them.

4. A method as in claim 1, 2, or 3 wherein the step of selectively introducing a second semiconductor dopant further includes selectively introducing the second dopant into the doped region to form a more highly doped region of the second conductivity type therein generally between each pair of vertical current-conducting regions nearest each other.

5. A method as in claim 4 and further including the step of removing at least one selected portion of the second polycrystalline layer overlying the device region between the lateral current-conducting regions so as to leave a second electrically conductive line coupling the first lateral current-conducting region to the remainder of the doped region still of the second conductivity type.

6. A method as in claim 5 wherein each step of selectively introducing includes using a silicon-nitride mask having openings at selected locations.

7. A method as in claim 6 wherein each of the vertical and first lateral current-conducting regions is a collector.

* * * * *